United States Patent
Schöniger et al.

(10) Patent No.: US 6,310,824 B1
(45) Date of Patent: Oct. 30, 2001

(54) INTEGRATED MEMORY WITH TWO BURST OPERATION TYPES

(75) Inventors: Sabine Schöniger; Peter Schrögmeier; Christian Weis, all of München; Stefan Dietrich, Türkenfeld, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/662,255

(22) Filed: Sep. 14, 2000

(30) Foreign Application Priority Data

Sep. 14, 1999 (DE) .............................................. 199 44 040

(51) Int. Cl.[7] ...................................................... G11C 8/00
(52) U.S. Cl. ........................ 365/233; 365/236; 365/240; 365/230.04
(58) Field of Search .............................. 365/233, 230.04, 365/240, 236; 711/218

(56) References Cited

U.S. PATENT DOCUMENTS

| | | | |
|---|---|---|---|
| 4,247,920 | * | 1/1981 | Springer et al. ...................... 365/230 |
| 5,333,294 | * | 7/1994 | Schnell .................................. 395/425 |
| 5,453,957 | * | 9/1995 | Norris et al. ..................... 365/230.04 |
| 5,526,320 | * | 6/1996 | Zagar et al. ....................... 365/233.5 |
| 5,708,688 | * | 1/1998 | Ting et al. ............................. 377/33 |
| 5,715,476 | * | 2/1998 | Kundu et al. ......................... 395/855 |
| 5,721,859 | * | 2/1998 | Manning ......................... 397/421.07 |
| 5,835,970 | | 11/1998 | Landry et al. ....................... 711/218 |
| 6,091,665 | * | 7/2000 | Dorney ................................. 365/236 |

* cited by examiner

*Primary Examiner*—Richard Elms
*Assistant Examiner*—Tuan T. Nguyen
(74) *Attorney, Agent, or Firm*—Herbert L. Lerner; Laurence A. Greenberg; Werner H. Stemer

(57) ABSTRACT

The memory has a bidirectional address counting unit C1; S, which performs a counting operation for the purpose of generating internal column addresses from an external column address A7 . . . 0. In this case, the counting direction is dependent on the burst operating mode and on an address bit A1 of the external column address. Moreover, the memory has a transformation unit C2; SR2, which forwards partial addresses A2 . . . 1'; PA3 . . . 0' generated by the address counting unit C1; S either unchanged or incremented by the value 1 to the second column decoder CDEC2, in a manner dependent on the burst operating mode and a further address bit A0 of the external column address A7 . . . 0.

4 Claims, 5 Drawing Sheets

FIG 3

| A2..0 | IL = 1 | | | SQ = ĪL = 1 | |
|---|---|---|---|---|---|
| | A2..1' | A2..1" | (CSLE, CSLO) | A2..1' | A2..1" | (CSLE, CSLO) |
| 000<br>001 | 00,01,10,11 | = A2..1' | (0,1),(2,3),(4,5),(6,7) | 00,01,10,11 | 00,01,10,11<br>01,10,11,00 | (0,1),(2,3),(4,5),(6,7),<br>(2,1),(4,3),(6,5),(0,7) |
| 010<br>011 | 01,00,11,10 | = A2..1' | (2,3),(0,1),(6,7),(4,5) | 01,10,11,00 | 01,10,11,00<br>10,11,00,01 | (2,3),(4,5),(6,7),(0,1),<br>(4,3),(6,5),(0,7),(2,1) |
| 100<br>101 | 10,11,00,01 | = A2..1' | (4,5),(6,7),(0,1),(2,3) | 10,11,00,01 | 10,11,00,01<br>11,00,01,10 | (4,5),(6,7),(0,1),(2,3),<br>(6,5),(0,7),(2,1),(4,3) |
| 110<br>111 | 11,10,01,00 | = A2..1' | (6,7),(4,5),(2,3),(0,1) | 11,00,01,10 | 11,00,01,10<br>00,01,10,11 | (6,7),(0,1),(2,3),(4,5),<br>(0,7),(2,1),(4,3),(6,5) |

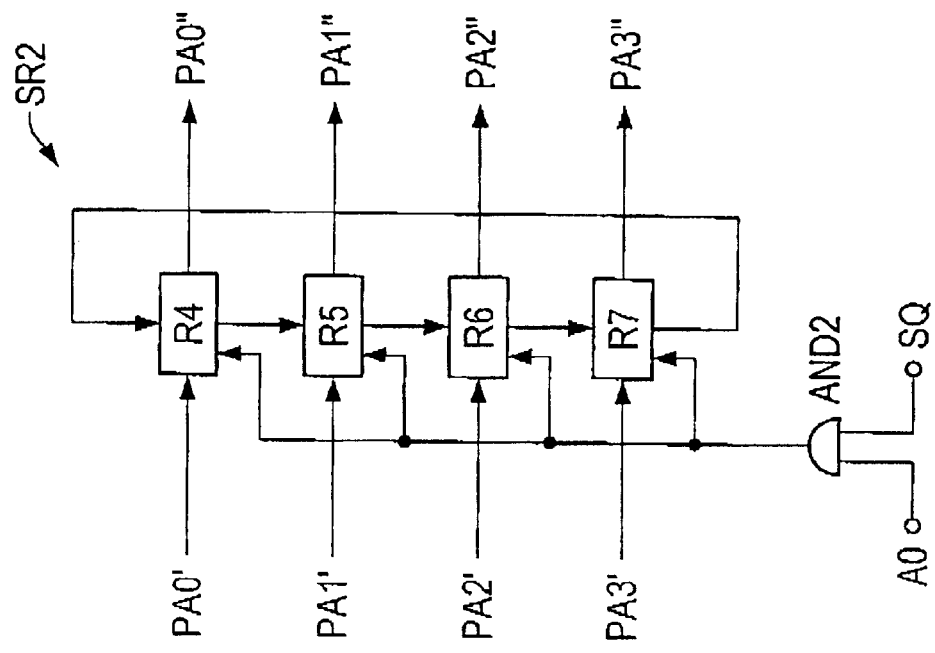
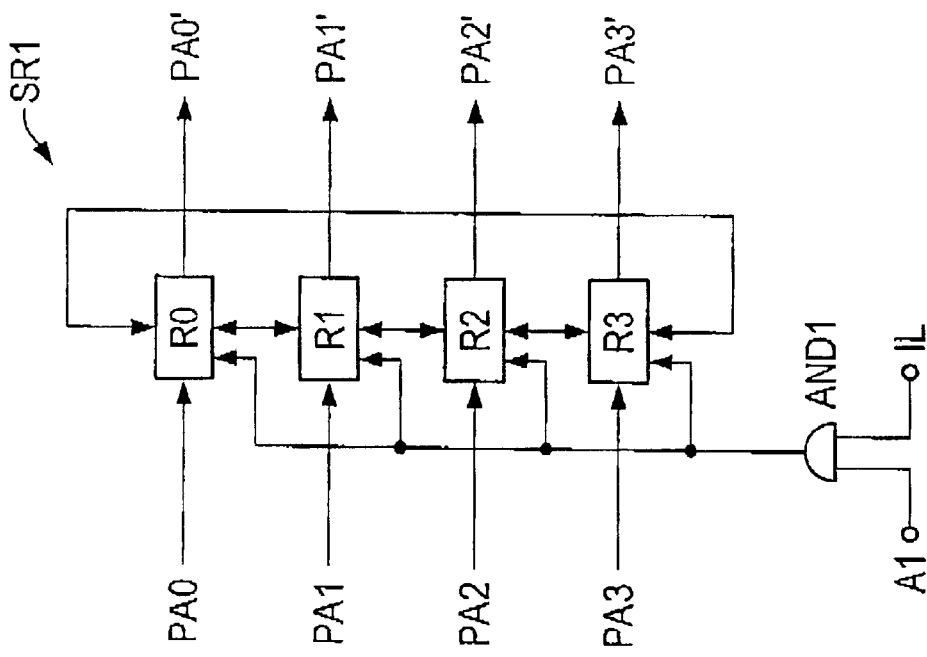

FIG 6

| A2...0 | PA3..0 | IL = 1 | | | SQ = ĪL = 1 | |
|---|---|---|---|---|---|---|
| | | PA3..0' | PA3...0" | PA3...0' | PA3...0" |
| 000<br>001 | } 0001 | } 0001,1000,0100,1000 | } = PA3...0' | } 0001,0010,0100,1000 | 0001,0010,0100,1000<br>0010,0100,1000,0001 |
| 010<br>011 | } 0010 | } 0010,0001,1000,0101 | } = PA3...0' | } 0010,0100,1000,0001 | 0010,0100,1000,0001<br>0100,1000,0001,0010 |

INTEGRATED MEMORY WITH TWO BURST OPERATION TYPES

BACKGROUND OF THE INVENTION

Field of the Invention

The invention relates to an integrated memory having two different burst operating modes.

Integrated memories usually have memory cells which are arranged in rows and columns. The rows can be accessed by means of row addresses and the columns can be accessed by means of column addresses. In some synchronous integrated memories, such as, for example, DDR SDRAMs (Double Data Rate Synchronous Dynamic Random Access Memories), when an external column address is applied in accordance with predetermined specifications, an access is made to a plurality of columns whose addresses succeed one another in a specific manner. Such an access is referred to as a "burst access".

The invention is based on the object of specifying an integrated memory having two different burst operating modes in which, for each burst operating mode, a different addressing order of the columns takes place during a burst access and which can be realized using relatively few components.

This object is achieved by means of an integrated memory in accordance with claim 1. The dependent claims relate to advantageous designs and developments of the invention.

In the memory according to the invention, a plurality of internal column addresses are generated from an external column address, fed to said memory, during each burst access. The order of these internal column addresses is dependent on the respective burst operating mode in which the memory is situated. The internal column addresses are composed of part of the external column address and a partial address generated by the bidirectional address counting unit. During each counting step of the address counting unit, another partial address and thus also another internal column address are generated. The address counting unit has the second counting direction whenever the memory is situated in the second burst operating mode or whenever it is situated in the first burst mode while, at the same time, the second least significant address bit of the external column address has a second logic state. By contrast, the address counting unit has the first counting direction when the memory is situated in the first burst operating mode and when, at the same time, the second least significant address bit of the external column address has the first logic state. In the second burst operating mode, the transformation unit serves for transforming the partial address fed to the second column decoder, provided that the least significant address bit of the external column address has a first logic state. In the other cases, that is to say when the least significant address bit has a second logic state or when the memory is situated in the first burst operating mode, the transformation unit directs the partial addresses generated by the address counting unit without transformation, that is to say unchanged, to the second column decoder. The transformation, which is performed by the transformation unit in the case mentioned, consists in the partial addresses fed to the transformation unit being incremented by the latter in each case by a specific value.

According to a first embodiment of the invention, the address counting unit is a bidirectional counter and the transformation unit is a unidirectional counter. According to a second embodiment, the address counting unit has a bidirectional shift register and the transformation unit has a unidirectional shift register.

The invention is explained in more detail below with reference to the figures, in which:

BRIEF DESCRIPTION OF THE DRAWINGS

FIG. 3 shows partial addresses and modified partial addresses generated during a burst access by an address counting unit in FIG. 1, FIG. 4 shows an exemplary embodiment of a bidirectional shift register from FIG. 2, FIG. 5 shows an exemplary embodiment of a unidirectional shift register from FIG. 2, and FIG. 6 shows partial addresses and modified partial addresses generated during a burst access by an address counting unit in FIG. 2.

DESCRIPTION OF THE PREFERRED EMBODIMENTS

Figure 1:
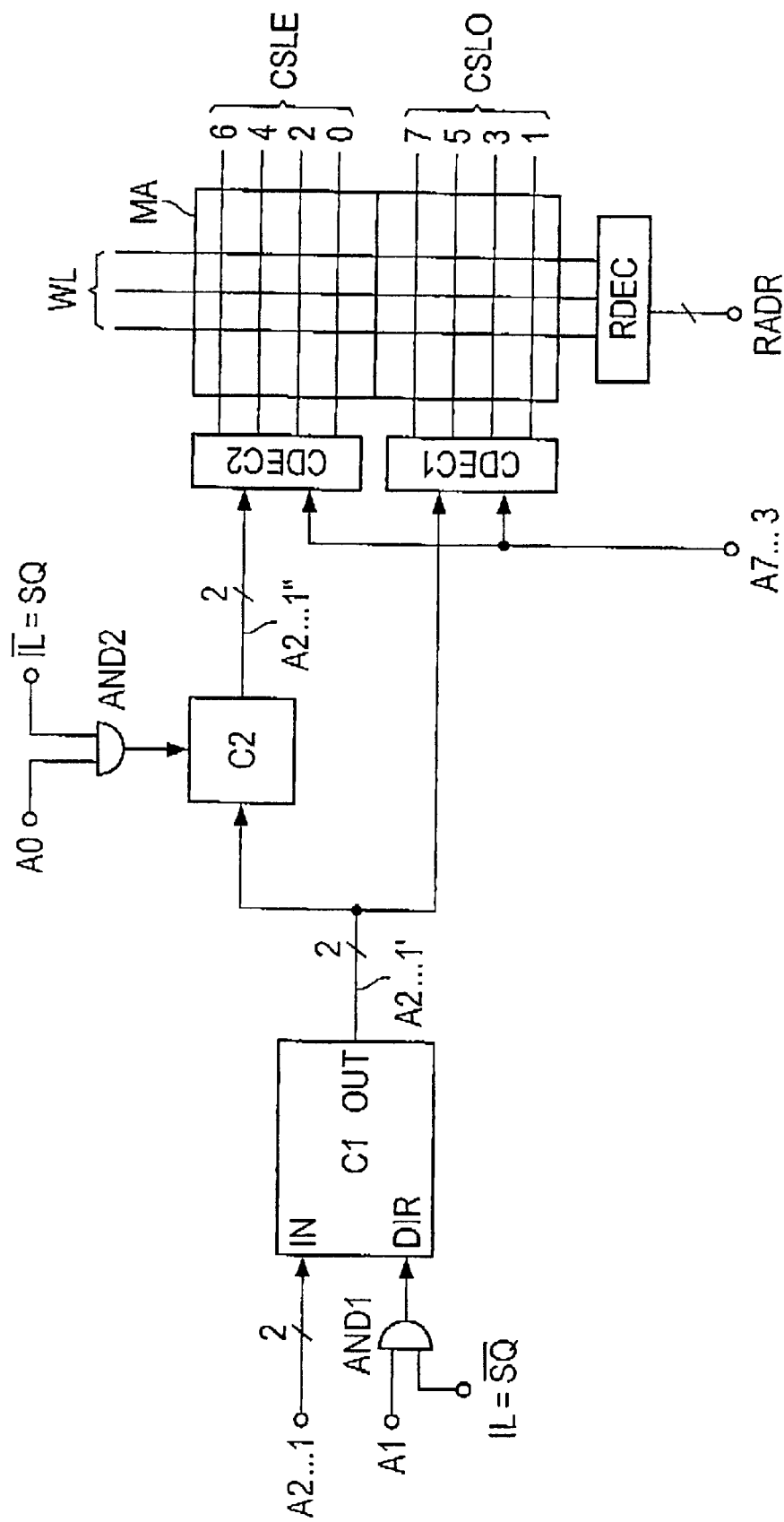
FIG. 1 shows a first exemplary embodiment of the integrated memory.
Figure 2:
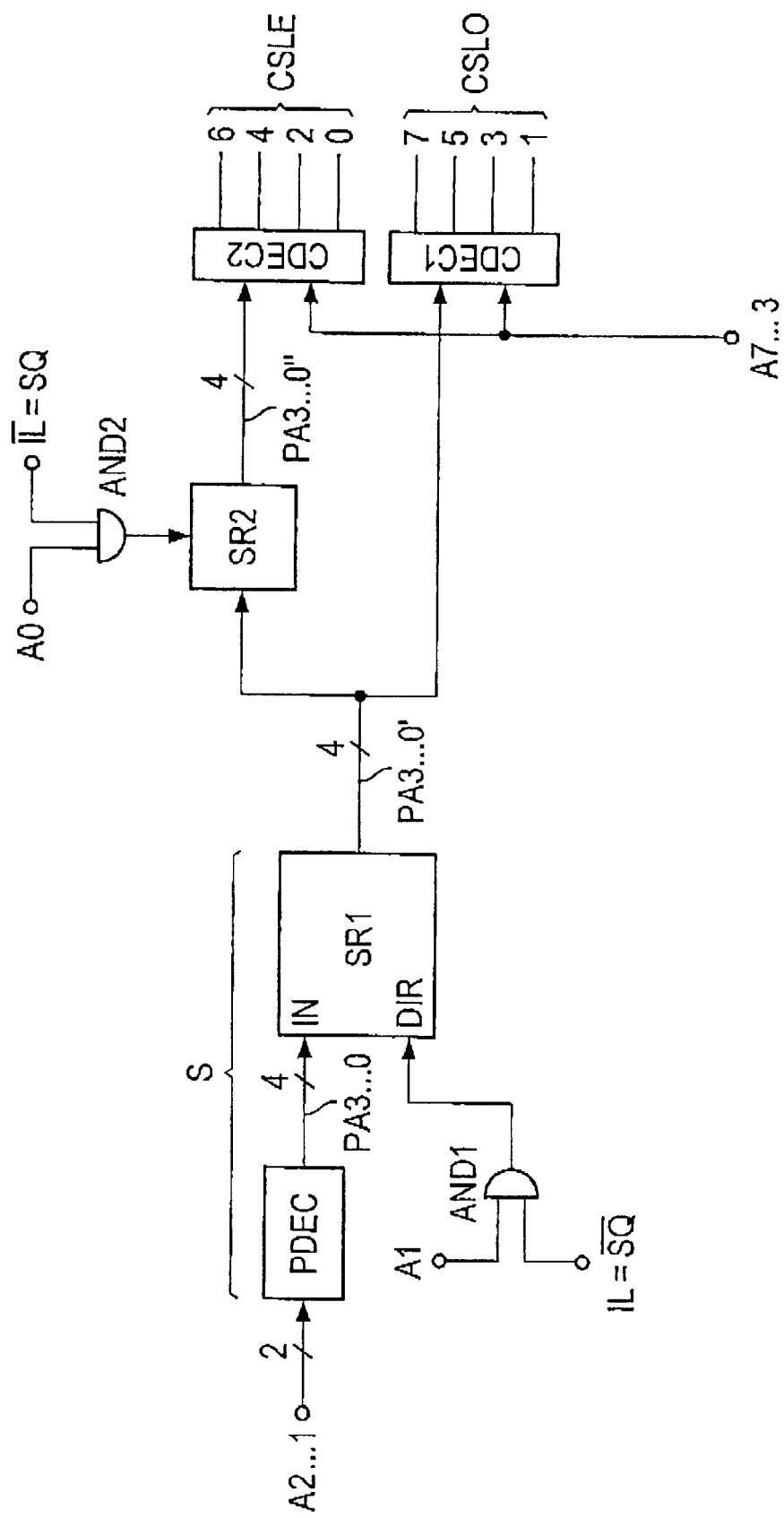
FIG. 2 shows a second exemplary embodiment of the integrated memory.

The exemplary embodiments of the integrated memory according to the invention which are explained below with reference to FIGS. 1 and 2 are so-called DDR SDRAMs (Double Data Rate Synchronous Dynamic Random Access Memories). In the case of these memories, data are written or read out in each case twice within one clock cycle, namely upon a rising edge and upon a falling edge of the clock signal. In this case, it is established that the two data items that are to be transferred during a clock cycle are each assigned to internal column addresses that are directly adjacent to one another. The memories have a first burst operating mode, which is referred to as "interleaved mode" hereinafter, and a second burst operating mode, which is referred to as "sequential mode" hereinafter. In the exemplary embodiments described here, eight column select lines are accessed during each burst access, to be precise four pairs of column select lines one after the other in each case. A "burst of eight" is thus involved.

FIG. 1 shows a first exemplary embodiment of the integrated memory according to the invention. In a memory cell array MA, the memory cells of the memory are arranged at crossover points of word lines WL and bit lines (not illustrated). Selection of one of the word lines WL is effected via a row decoder RDEC in a manner dependent on an external row address RADR. Selection of in each case a plurality of the bit lines is effected by means of column select lines CSLE, CSLO via a first column decoder CDEC1 and a second column decoder CDEC2 in a manner dependent on external column addresses A7 . . . 0 fed to the memory. The memory cell array MA is subdivided into two halves. The first column select lines CSLO are situated in one half and the second column select lines CSLE in the second half of the memory cell array MA. The first column select lines CSLO are connected to the outputs of the first column decoder CDEC1 and the second column select lines CSLE are connected to the outputs of the second column decoder CDEC2.

The external column addresses A7 . . . 0 consist of eight address bits A7, A6, A5, A4, A3, A2, A1, A0. In this case, the address bit A7 is the most significant address bit (MSB, Most Significant Bit) and the address bit A0 is the least significant bit (LSB). Accordingly, the address bit A1 is the second least significant address bit and the address bit A2 is the third least significant address bit of the external column address A7 . . . 0.

The two column decoders CDEC1, CDEC2 simultaneously activate one of the first column select lines CSLO and one of the second column select lines CSLE. This is done in a manner dependent on internal column addresses fed to their inputs. For the first column decoder CDEC1, the internal column addresses are composed of the more significant address bits A7 to A3 of the external column address and a partial address A2 . . . 1'. For the second column decoder CDEC2, the internal column addresses are composed of the address bits A7 to A3 of the external column address A7 . . . 0 and also a modified partial address A2 . . . 1".

FIG. 1 illustrates only four column select lines, which form a burst group, in each case in each half of the cell array MA, although in reality there are a much larger number of identical burst groups present. The burst groups differ with regard to the addresses of their column select lines in terms of the five most significant address bits thereof, which correspond to the more significant bits A7 . . . 3 of the current external column address A7 . . . 0 in each case. Thus, eight column select lines in each case form one burst group. All the column select lines of one of the burst groups are accessed during a burst access. Within each burst group, the column select lines differ in terms of the two least significant bits of the internal column address and also in terms of the half of the cell array MA in which they are situated.

The first column select lines CSLO of each burst group are assigned odd numbers 1, 3, 5, 7 and the second column select lines CSLE are assigned even numbers 0, 2, 4, 6. These numbers may be understood as internal three-bit partial addresses of the respective burst group. Accordingly, then, the first column select lines are assigned odd column addresses and the second column select lines are assigned even column addresses. However, the column select lines of a burst group are distinguished from one another only by two address bits A2 . . . 1' and A2 . . . 1", respectively. This is because two of them are always selected simultaneously via the two column decoders CDEC1, CDEC2. The precise addressing of the column select lines will be discussed further below with reference to FIG. 3.

The generation of the partial addresses A2 . . . 1' and of the modified partial address A2 . . . 1" is explained below. The memory has a digital bidirectional counter C1, which generates the partial addresses A2 . . . 1' at its outputs OUT. The bidirectional counter C1 has inputs IN, to which the second least significant address bit A1 and the third least significant address bit A2 of the external column address are fed. Furthermore, it has a control input DIR, via which its counting direction can be set. An output of a first AND gate AND1 is connected to the control input DIR. A first input of the first AND gate AND1 is connected to the second least significant address bit A1 of the external column address A7 . . . 0. A second input is connected to an operating mode signal IL. In the case of a high level of the operating mode signal IL, the memory is situated in the interleaved mode. In the case of a low level of the operating mode signal IL, the memory is situated in the sequential mode.

At its outputs, the bidirectional counter C1 outputs four of the partial addresses A2 . . . 1' successively during each burst access. At the beginning of a burst access, it outputs firstly the address bits A2 and A1 of the external column address A7 . . . 0 unchanged as first partial address A2 . . . 1' at its outputs. Afterwards, the following three partial addresses of this burst access are generated by a respective counting step of the counter C1. In this case, the counter C1 operates with two positions and without a carry. The two address bits A2, A1 of the external column address A7 . . . 0 serve as the start address, said external column address being present at the address terminals of the memory at the beginning of the burst access. The counter C1 has a positive counting direction, in which it increments the start address by the value 1 in each case, and a negative counting direction, in which it decrements the start address by the value 1 upon each counting step. The counter C1 operates with the negative counting direction only when the memory is situated in the interleaved mode (IL=1) and when the second least significant address bit A1 of the external column address A7 . . . 0 has a high level. Otherwise, it operates with the positive counting direction.

The outputs OUT of the bidirectional counter C1 are connected directly to the first column decoder CDEC1 and, via a digital unidirectional counter C2 with a positive counting direction, which likewise has two positions and counts without a carry, to the second column decoder CDEC2. A control input of the unidirectional counter C2 is connected to the output of a second AND gate AND2. A first input of the second AND gate AND2 is connected to the least significant address bit A0 of the external column address A7 . . . 0 and a second input is connected to the inverted operating mode signal /IL. The unidirectional counter C2 communicates the partial address A2 . . . 1' generated by the bidirectional counter C1 unchanged as modified partial address A2 . . . 1" to the second column decoder CDEC2 when a low level is present at its control input. By contrast, the unidirectional counter C2 performs a transformation of the partial address A2 . . . 1', so that the modified partial address A2 . . . 1" differs from the latter, when a high level is present at its control input. This is the case only when the memory is situated in the sequential mode and the least significant address bit A0 has a high level.

The transformation performed by the unidirectional counter consists in said counter incrementing partial addresses A2 . . . 1' fed to it by the value 1.

FIG. 3 shows the addressing order of the column select lines CSLE, CSLO from FIG. 1 in the interleaved mode (IL=1) and in the sequential mode (/IL=SQ=1) as a function of different levels of the three least significant address bits A2 to A0 of the external column address A7 . . . 0. As already mentioned, the more significant address bits A7 to A3 of the external column address A7 . . . 0 serve for identifying different burst groups each having eight column select lines, namely in each case four in each half of the cell array. Only one of these groups having eight column select lines is illustrated in the cell array MA from FIG. 1. Within each burst group, the column select lines each have the numbers 1 to 7 and 0 to 6 entered in FIG. 1. For this reason, the table in FIG. 3 applies to each of these groups comprising eight column select lines in each case.

The table in FIG. 3 is constructed as follows: the first column contains the eight different logic states of the three least significant address bits A2 to A0 of the external column address A7 . . . 0. The next three columns apply to the interleaved mode (IL=1) and show the logic states of the partial addresses A2 . . . 1', and of the modified partial addresses A2 . . . 1" and also the numbers of the first column select lines CSLO and second column select lines CSLE in the order of their pairwise addressing during a burst access. As already mentioned, the bidirectional counter C1 generates the partial addresses A2 . . . 1', beginning with the start address formed by the value of the third least significant address bit A2 and of the second least significant address bit A1, by triple incrementing. The four differential partial addresses A2 . . . 1' of the burst access which are generated in this way, with a width of two bits in each case, are separated from one another by commas in the second column of FIG. 3. In the interleaved mode, the modified partial addresses A2 . . . 1" do not differ from the partial addresses A2 . . . 1'.

The last three columns of the table in FIG. 3 show the partial addresses, modified partial addresses and also the numbers of the column select lines CSLE, CSLO—activated by the column decoders CDEC1, CDEC2—in a corresponding manner for the sequential mode (/IL=1).

FIG. 3 reveals that the least significant address bit A0 of the external column address has no influence on the partial addresses A2 . . . 1'. The least significant address bit A0 has an influence on the modified partial addresses A2 . . . 1" only in the sequential mode. In the last-mentioned case, the partial address A2 . . . 1' fed to the unidirectional counter C2 is incremented by the value 1 when the least significant address bit has a high level. In all other cases, that is to say when the less significant address bit A0 has a low level or the memory is situated in the interleaved mode, the modified partial addresses A2 . . . 1" correspond to the partial addresses A2 . . . 1'.

Furthermore, FIG. 3 reveals that the counting direction of the bidirectional counter C1 is always positive in the sequential mode, whereas it depends on the level of the second least significant address bit A1 in the interleaved mode. In the interleaved mode, the counting direction is positive if the second least significant address bit A1 has a low level, and negative if it has a high level.

The fourth and seventh columns of the table in FIG. 3 are to be understood as follows: the pairs of numbers combined in round brackets specify the numbers—entered in FIG. 1—of the column select lines CSLO, CSLE of the burst group respectively identified by the more significant address bits A7 . . . 3 of the external column address which are addressed via the two column decoders CDEC1, CDEC2 in a manner dependent on the partial addresses A2 . . . 1' and modified partial addresses A2 . . . 1", respectively, during the burst access. If the same address 00 is fed to both column decoders, they address that column select line with the lowest number 0 or 1 in the respectively identified group. With ascending partial addresses or modified partial addresses to be decoded in each case, the column decoders activate the column select lines with the correspondingly higher numbers in FIG. 1.

By way of example, in accordance with FIG. 3, in the sequential mode (SQ=1) given A2 . . . 0=001, the column select lines of the respectively addressed burst group are addressed in pairs in the order (2,1), (4,3), (6,5), (0,7). This means that the two column select lines with the numbers 2 and 1 are addressed by the first partial address A2 . . . 1'=00 (fifth column in FIG. 3) of the burst access, said partial address being generated by the bidirectional counter C1, and those column select lines with the numbers 4 and 3 are addressed by the second partial address A2 . . . 1'=01, and so on.

FIG. 2 shows a second exemplary embodiment of the memory according to the invention, which, instead of the bidirectional counter C1, as address counting unit S, has a bidirectional shift register SR1 and also a predecoder PDEC connected upstream of the inputs IN of said shift register. Instead of the unidirectional counter C2, the memory in FIG. 2 has a unidirectional shift register SR2. Identical reference symbols in FIG. 2 designate components identical to those in FIG. 1. The shift direction of the bidirectional shift register SR1 is influenced via the first AND gate AND1. The second AND gate AND2 influences whether or not the unidirectional shift register SR2 performs a shift operation.

In a manner dependent on the third least significant address bit A2 and the second least significant address bit A1, the predecoder PDEC from FIG. 2 activates one of four predecoded lines which feed predecoded addresses PA3 . . . 0 to the bidirectional shift register SR1.

FIG. 4 shows the structure of the bidirectional shift register SR1 from FIG. 2. As a start address, said shift register loads the predecoded addresses PA3 . . . 0 into registers R0 to R3. First of all, this start address is forwarded as a first of the partial addresses PA3 . . . 0' of this burst access to the outputs of the bidirectional shift register SR1. Afterwards, this start address is incremented or decremented by ring-type shifting in the shift direction determined by the first AND gate AND1. The incrementing or decrementing is effected three times, so that a total of four partial addresses PA3 . . . 0' are generated from each start address.

FIG. 5 shows the structure of the unidirectional shift register SR2 from FIG. 2. The partial addresses PA3 . . . 0' generated by the bidirectional shift register SR1 are fed to said unidirectional shift register. Said partial addresses are buffer-stored in registers R4 to R7. In a manner dependent on the output signal of the second AND gate AND2, the unidirectional shift register SR2 outputs the partial addresses PA3 . . . 0' fed to it either unchanged or incremented by the value 1 (by means of a single shifting step) as modified partial addresses PA3 . . . 0" to its outputs.

For the memory from FIG. 2, FIG. 6 shows the resulting predecoded addresses PA3 . . . 0, partial addresses PA3 . . . 0' and modified partial addresses PA3 . . . 0" for the first four logic states of the three least significant address bits A2 . . . 0. The numbers of the column select lines CSLO, CSLE respectively activated by the column decoders CDEC1, CDEC2 are identical to those from FIG. 3, so that they have not been entered again in FIG. 6. Moreover, the remaining four logic states of the three least significant address bits A2 to A0 have not been specified in FIG. 6. Like the values illustrated in FIG. 6, they emerge in an equivalent manner from FIG. 3.

In the case of the memories illustrated in FIGS. 1 and 2, just two address bits, namely A2 and A1, serve for defining the respective start address for a burst access. Depending on this start address, a total of eight column select lines CSLO, CSLE are successively activated in pairs. A burst having a burst length of eight is thus involved. It goes without saying that it is also possible to derive a start address from more than two address bits of the external column address and thus to realize longer burst lengths. In that case, correspondingly more column select lines belong to each group of column select lines which are activated during a burst access.

What is claimed is:
1. An integrated memory, comprising:
address inputs for feeding in external column addresses having a least significant address bit, a second least significant address bit, and a third least significant address bit;
a first column decoder for selecting first column select lines and a second column decoder for selecting second column select lines, each of said column decoders having first and second inputs for feeding in internal column addresses derived from the external column addresses;
a bidirectional address counting unit, said address counting unit:

receiving at least a second and a third least significant address bit of one of the external column addresses as a start address in a first burst operating mode and in a second burst operating mode;

performing a counting step in each case for generating partial addresses of a plurality of the internal column addresses, proceeding from the start address; and having a first counting direction in the first burst operating mode in the case of a first logic state of the second least significant address bit, and a second counting direction in other cases;

wherein those address bits of the external column address that are not fed to said address counting unit, except the least significant address bit, are fed to said first inputs of said two column decoders;

said address counting unit, for transferring the partial addresses generated thereby, having an output connected to said second inputs of said first column decoder and, via a transformation unit, to said second inputs of said second column decoder;

said transformation unit incrementing the partial address generated by said address counting unit by a specific value in the second burst operating mode in the case of a first logic state of the least significant address bit of the external column address and, in the other cases, forwarding the partial address unchanged to said second inputs of said second column decoder.

2. The integrated memory according to claim 1, wherein said address counting unit has a bidirectional counter;

said transformation unit has a unidirectional counter receiving, as start addresses, the partial addresses generated by said address counting unit and forwarding to said second column decoder the addresses either unchanged or incremented by the specific value.

3. The integrated memory according to claim 1, wherein said address counting unit has a predecoder having k outputs and a bidirectional shift register with k first register elements each having an input and an output;

said outputs of said predecoder are connected to a respective one of said inputs of said shift register;

the counting direction of said address counting unit corresponds to the shift direction of said shift register;

said transformation unit has a unidirectional shift register with k second register elements each having an input and an output;

said outputs of said bidirectional shift register are connected to said inputs of said unidirectional shift register;

said outputs of said unidirectional shift register are connected to said second inputs of said second column decoder; and said unidirectional shift register forwards the partial addresses generated by said address counting unit either unchanged or incremented by the specific value to said second column decoder.

4. The integrated memory according to claim 1, wherein said first column select lines are assigned odd column addresses and said second column select lines are assigned even column addresses.

* * * * *